(12) United States Patent
Nozawa et al.

(10) Patent No.: US 7,039,847 B2
(45) Date of Patent: May 2, 2006

(54) CODING-DECODING DEVICE AND METHOD FOR CONVERSION OF BINARY SEQUENCES

(75) Inventors: Hiroshi Nozawa, Uji (JP); Shinzo Koyama, Kyoto (JP); Masao Takayama, Kyoto (JP); Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 499 days.

(21) Appl. No.: 10/238,984

(22) Filed: Sep. 9, 2002

(65) Prior Publication Data

US 2003/0172340 A1    Sep. 11, 2003

(30) Foreign Application Priority Data

Mar. 5, 2002  (JP) .............................. 2002-058576

(51) Int. Cl.
*G11C 29/00*   (2006.01)

(52) U.S. Cl. ..................................... 714/768

(58) Field of Classification Search ................ 714/746, 714/755, 784, 792, 768; 341/100, 143; 375/265, 375/341
See application file for complete search history.

(56) References Cited

U.S. PATENT DOCUMENTS 4,833,471 A * 5/1989 Tokuume et al. ............. 341/67
6,278,748 B1 * 8/2001 Fu et al. ..................... 375/341

* cited by examiner

*Primary Examiner*—Guy Lamarre
*Assistant Examiner*—James C. Kerveros
(74) *Attorney, Agent, or Firm*—Hogan & Hartson, LLP

(57) ABSTRACT

A coding-decoding device and a coding-decoding method that take less time for coding and decoding are provided while using less number of logic gates. A memory device 15 substantially stores b pieces of conversion logic equations produced with a conversion logic equation producing device 13. An operation device 17 has a programmable hardware logic circuit to constitute logics sequentially according to plural execution unit logic equations obtained by dividing b pieces of conversion logic equations stored in the memory device 15 into execution units for respective execution unit logic equations using the hardware logic circuit. Besides, the operation device 17 sequentially divides and calculates the second sentences from the first sentences according to the constituted logics. An output device 19 collects and outputs the second sentences calculated with the operation device 17.

4 Claims, 10 Drawing Sheets

Fig. 7

| k | $M_k$ $a_1a_2a_3$ | $C_k$ $A_1A_2A_3$ | $A_{1j(1)}$ $a_1a_2a_3$ | $A_{2j(2)}$ $a_1a_2a_3$ | $A_{3j(3)}$ $a_1a_2a_3$ |
|---|---|---|---|---|---|
| 0 | 000 | 100 | 000 | — | — |
| 1 | 001 | 001 | — | — | 001 |
| 2 | 010 | 011 | — | 010 | 010 |
| 3 | 011 | 110 | 011 | 011 | — |
| 4 | 100 | 000 | — | — | — |
| 5 | 101 | 101 | 101 | — | 101 |
| 6 | 110 | 111 | 110 | 110 | 110 |
| 7 | 111 | 010 | — | 111 | — |

Fig. 8A
$$A_1 = /a_1 \cdot /a_2 \cdot /a_3 + /a_1 \cdot a_2 \cdot a_3 + a_1 \cdot /a_2 \cdot a_3 + a_1 \cdot a_2 \cdot /a_3$$
$$= A_{11} + A_{12} + A_{13} + A_{14}$$

Fig. 8B
$$A_2 = /a_1 \cdot a_2 \cdot /a_3 + /a_1 \cdot a_2 \cdot a_3 + a_1 \cdot /a_2 \cdot /a_3 + a_1 \cdot a_2 \cdot a_3$$
$$= A_{21} + A_{22} + A_{23} + A_{24}$$

Fig. 8C
$$A_3 = /a_1 \cdot /a_2 \cdot a_3 + /a_1 \cdot a_2 \cdot /a_3 + a_1 \cdot /a_2 \cdot /a_3 + a_1 \cdot a_2 \cdot /a_3$$
$$= A_{31} + A_{32} + A_{33} + A_{34}$$

CODING-DECODING DEVICE AND METHOD FOR CONVERSION OF BINARY SEQUENCES

CROSS-REFERENCE TO RELATED APPLICATIONS

The entire disclosure of a Japanese Patent Application No. 2002-58576 filed on Mar. 5, 2002 including its specification, claims, drawings, and summary are incorporated herein by reference in its entirety.

BACKGROUND OF THE INVENTION

1. Field of the Invention

The present invention relates to a coding-decoding device and a coding-decoding method, in particular to a technique for converting a first sentence expressed in binary numbers into a second sentence expressed in binary numbers.

2. Description of Prior Art

The RSA coding system is known as one of coding systems. In the course of processing with the RSA coding system, a plain sentence M is ciphered into a coded sentence C according to the following equation using a public key (n, e) where n is a product of any two prime numbers p and q, and e is any number that satisfies a certain limitation to the prime numbers p and q:

$$C = M^e \pmod{n}$$

The coded sentence C may also be decoded into the plain sentence M according to the following equation using a secret key (n, d) where n is the same as the above and d is a number derived uniquely from the above e, and the prime numbers p and q:

$$M = C^d \pmod{n}$$

Here, if a third person succeeds in solving the n of the public key (n, e) to derive the prime numbers p and q, the person can easily find the d based on the prime numbers and e, and obtain the secret key (n, d).

However, if the value of the above n is increased, factoring for obtaining the p and q takes enormous time, making it practically impossible to decode. In this way, the RSA coding system secures its security by increasing the value of the n.

However, the conventional RSA coding system has so far been faced with the following problems. That is to say, the coding requires e times of multiplication with the plain sentence M. And its decoding requires d times of multiplication with the coded sentence C. Therefore, the problem is that the greater the n for higher security, the longer the time taken for coding and decoding.

To solve the above problem, it is conceivable to use a coding circuit constituted with hardware only. FIG. 10 shows a circuit 1, corresponding to 1 bit of the coded sentence, of a coding circuit for converting a b-bit plain sentence into a b-bit coded sentence.

The circuit 1 is constituted with $2^{b-1}$ pieces of b-input AND gates 3 and 1 piece of $2^{b-1}$ input OR gate 5. Therefore, the entire coding circuit requires logic gates that are b times in number of the above. While using this type of coding circuit can reduce the time for coding, enormous number of logic gates is required. The problem is the same for decoding.

SUMMARY OF THE INVENTION

The present invention is intended to solve the above problems associated with the conventional coding method and decoding method by providing a coding-decoding device and a coding-decoding method that take less time for coding and decoding while using less number of logic gates.

A coding-decoding device according to the present invention uses a memory device and an operation device having programmable hardware logic circuits to convert a first sentence expressed with binary numbers into a second sentence expressed with binary numbers of b bits. The memory device substantially stores b pieces of conversion logic equations, each including the bit value of the first sentence as an element, for calculating b pieces of bit values of the second sentence. The operation device, according to plural execution unit logic equations, obtained by dividing b pieces of conversion logic equations stored in the memory device into execution units, sequentially constitutes logics for each of the execution unit logic equations using a hardware logic circuit, sequentially divides and calculates the second sentence from the first sentence according to the constituted logic.

The coding-decoding device according to the present invention comprises a memory matrix section, a switch matrix section, a control section, and a shift resister, to calculate a second sentence expressed in binary numbers of b bits from a first sentence expressed in binary numbers. When coding and decoding keys are entered, the control section calculates according to those keys b pieces of conversion logic equations for calculating each bit value of the second sentence, expressed as a logical sum of logical products having the bit values of the first sentence as elements. The memory matrix section stores, under the control of the control section, b pieces of conversion logic equations calculated in the control section. The switch matrix section sequentially calculates, under the control of the control section, each bit value of the second sentence according to the b pieces of conversion logic equations stored in the memory matrix section on the basis of each bit value of the first sentence inputted. The shift register shifts and stores each bit value of the second sentence coming as sent in succession from the switch matrix section and, when bit values for b bits are accumulated, outputs them as a second sentence.

The coding-decoding method according to the present invention uses a memory device and an operation device having a programmable hardware logic circuit and converts a first sentence expressed with binary numbers into a second sentence expressed with b bits of binary numbers, in a step of storing conversion logic equations and an operation step. In the conversion logic equation storing step, the memory device substantially stores b pieces of conversion logic equations, for calculating b pieces of bit values of the second sentence, respectively including as elements the bit values of the first sentence. In the operation step, the operation device sequentially constitutes a logic for every execution unit logic equation using the hardware logic circuit according to plural execution unit logic equations obtained by dividing b pieces of conversion logic equations stored in the memory device into execution units, and at the same time, sequentially divides and calculates the second sentences from the first sentences according to the logic constitution.

While the features of the present invention are broadly described above, the constitution and contents of the inven-

BRIEF DESCRIPTION OF THE DRAWINGS

FIG. 7 illustrates the concept of conversion logic equation producing sequence.

FIGS. 8A to 8C illustrate the concept of conversion logic equation producing sequence.

DESCRIPTION OF PREFERRED EMBODIMENTS

Figure 1:
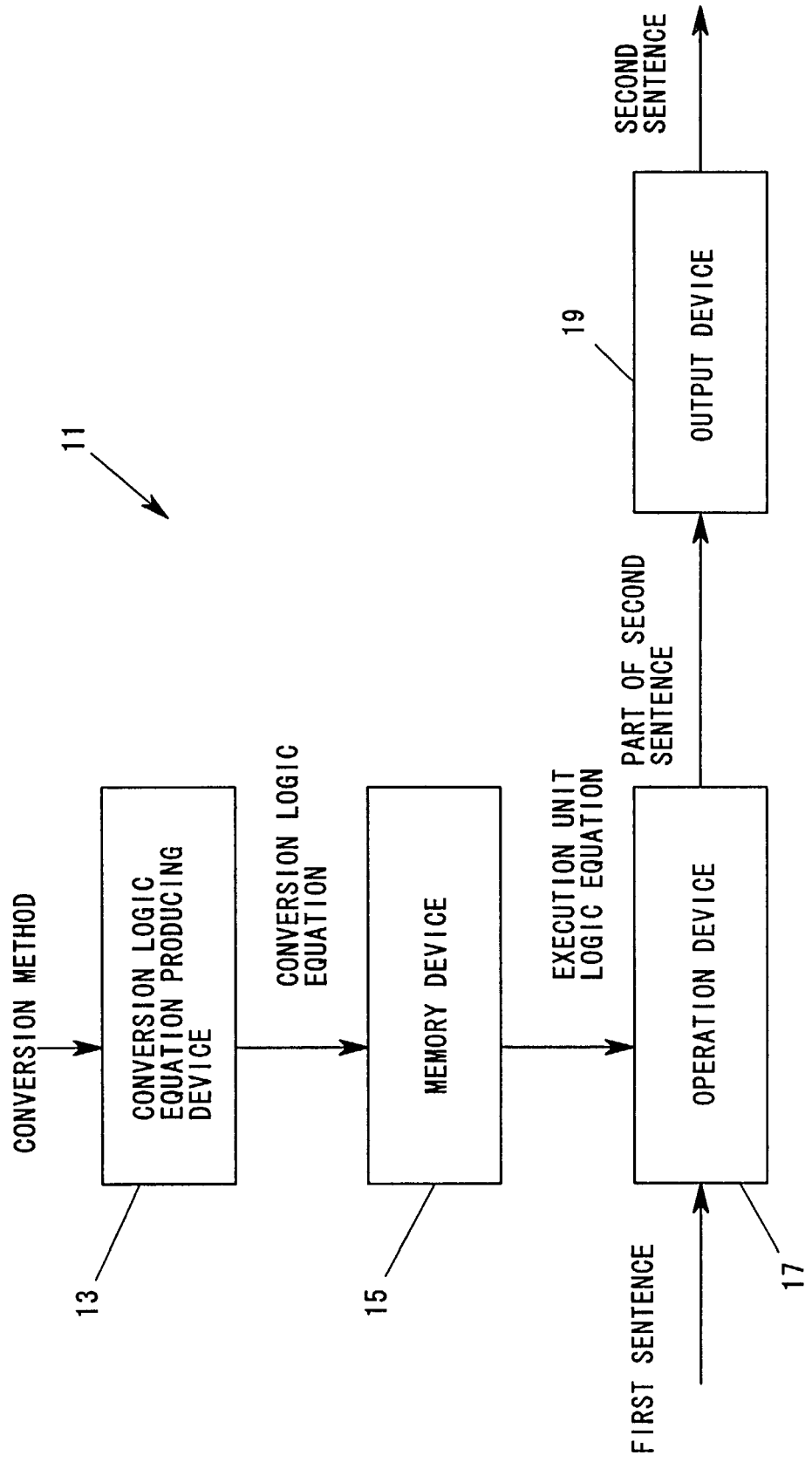
FIG. 1 is a block diagram of the constitution of a coding-decoding device 11 as an embodiment of the invention.

FIG. 1 is a block diagram of the constitution of a coding-decoding device 11 as an embodiment of the invention. The coding-decoding device 11 comprises: a conversion logic equation producing device 13, a memory device 15, an operation device 17, and an output device 19, to convert first sentences expressed with binary numbers into second sentences expressed with binary numbers of b bits, and outputs them.

The conversion logic equation producing device 13, according to a given conversion method, first converts all the first sentences into second sentences. In the case any bit of a second sentence obtained by conversion has a bit value of a logic "1," the conversion logic equation producing device 13 gives a term (logical product term) as a term corresponding to that bit which expresses a logical product of all the bit values constituting the corresponding first sentence. Conversion logic equations, b pieces in number, are obtained by taking the logical sum of the logical products for the respective b pieces of bit values of the second sentence.

The b pieces of conversion logic equations obtained in this way are respectively logic equations that include as elements the bit values of the first sentences, and used to calculate b pieces of bit values of the second sentences. The conversion logic equation obtained is expressed with the bit values of the second sentence as the logical sum of the logical products containing the bit values of the first sentence as elements.

The memory device 15 substantially stores the b pieces of conversion logic equations produced with the conversion logic equation producing device 13.

The operation device 17 has a programmable hardware logic circuit and uses it to sequentially constitute logics for each execution unit logic equation according to plural execution unit logic equations formed by dividing b pieces of conversion logic equations stored in the memory device 15 into execution units. The operation device 17 further sequentially divides and calculates the second sentences from the first sentences according to the constituted logics.

The above-mentioned execution unit logic equation is a logical operation equation for determining a logical product that constitutes the conversion logic equation. The operation device 17 is constituted, in the operation for determining the bit value of the second sentence, to determine the bit value to be a logic "1" and discontinue the bit value operation at the time point where any of the logic products that constitute the conversion equation corresponding to the bit value becomes "1."

The output device 19 outputs the second sentence calculated with the operation device 17. That is to say, the output device 19 in the middle of operation of the second sentences stores and holds incomplete second sentences sequentially calculated with the operation device 17 and, when the operation is over, outputs completed second sentences.

Figure 2:
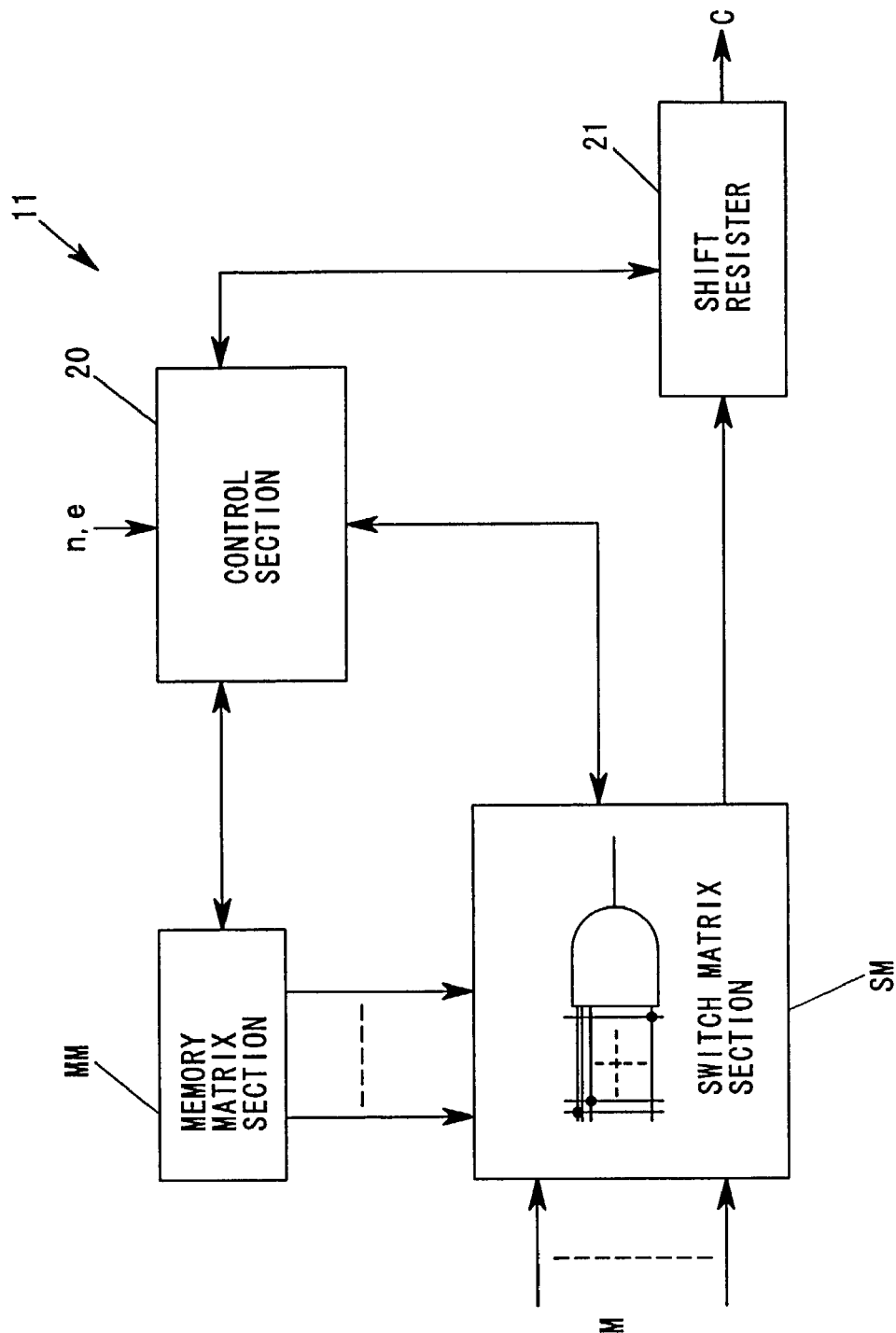
FIG. 2 is a block diagram of a coding-decoding device 11 in FIG. 1 that is constituted with an FPGA.

Next, FIG. 2 is a block diagram of a constitution of the coding-decoding device 11 in FIG. 1 that is using an FPGA (field programmable gate array). In FIG. 2, the coding-decoding device 11 comprises: a memory matrix section MM, a switch matrix section SM, a control section 20, and a shift resister 21. The control section 20 is constituted with software or hardware logic and controls respective actions of the coding-decoding device 11.

The memory matrix section MM and the control section 20 in FIG. 2 correspond to the memory device 15 shown in FIG. 1. The switch matrix section SM and the control section 20 correspond to the operation device 17. The shift resister 21 and the control section 20 correspond to the output device 19. The control section 20 also corresponds to the conversion logic equation producing device 13. Incidentally, description of this embodiment relates to an example case in which the coding-decoding device 11 calculates a coded sentence C or a b-bit second sentence from a b-bit first sentence or a plain sentence M using the RSA coding system.

The control section 20, when public keys (n, e) of the RSA coding system are entered, calculates b pieces of conversion logic equations based on the public keys entered. The b pieces of conversion logic equations are respectively logic equations for calculating respective bit values $A_1, A_2, \ldots$ of the coded sentence C, and expressed as the logical sum of the logical products formed with b pieces of bit values $a_1, a_2, \ldots$ of the plain sentence (Refer to FIGS. 8A to 8C) as elements.

The memory matrix section MM, under the control of the control section 20, stores the b pieces of conversion logic equations calculated with the control section 20.

The switch matrix section SM, under the control of the control section 20, sequentially calculates respective bit values of the coded sentence C according to the b pieces of conversion logic equations stored in the memory matrix section MM on the basis of respective bit values of the plain sentence M entered.

The shift resister 21 shifts and stores each bit value of the coded sentence C coming sent in succession from the switch matrix section SM and, when bit values for b bits are ready, outputs them as the coded sentence C.

Figure 3:
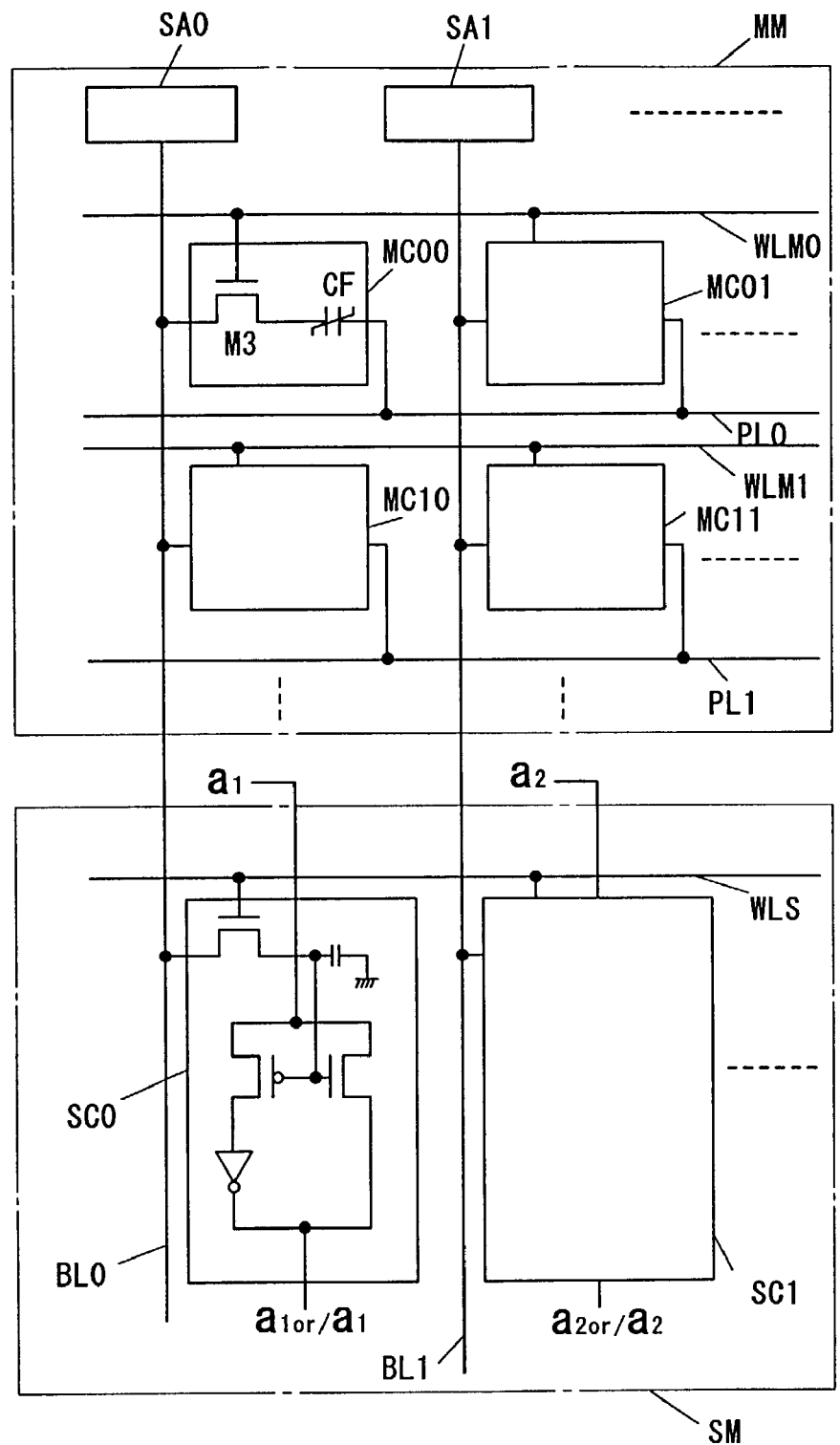
FIG. 3 shows an example circuit of a memory matrix section MM and a switch matrix section SM of the coding-decoding device 11.

FIG. 3 shows an example circuit of a memory matrix section MM and a switch matrix section SM of the coding-decoding device 11.

The memory matrix section MM comprises plural memory cells MC00, MC01, . . . , each using a memory element for storing switching data, arranged in rows and columns. This embodiment is arranged to store b pieces of logical values (logic "1" or logic "0"), constituting one logical product term of the conversion logic equation, respectively as switching data in one row of memory cells MC00, MC01, . . . (b pieces of memory cells). Therefore, $2^{b-1}$ rows of memory cells are prepared to store 1 piece of conversion logic equation. That is to say, memory cells are prepared at least in $b*2^{b-1}$ rows by b columns to store b pieces of conversion logic equations.

The switch matrix section SM is arranged with plural switch cells SC0, SC1, . . . , that take either non-inverted state or inverted state, in a row corresponding to the same row of memory cells, for example the memory cells MC00, MC01, . . . of the memory matrix section MM. Therefore, at least b pieces of switch cells are prepared in this embodiment.

Though not shown, the switch matrix section SM is provided with an AND gate of b inputs. The AND gate receives as inputs b pieces of outputs (for example the signals appearing at the terminal 33 in FIG. 5 in the case of the switch cell SC0) and calculates logical products of these data.

Incidentally, the switch matrix section SM may also be constituted with two or more rows of switch cells. In that case, plural switch purpose word lines are required to choose the rows of the switch matrix section SM. Furthermore, the switch cells constituting the switch matrix section SM may be arranged in a matrix having the same numbers of rows and columns as those of the memory cells constituting the memory matrix section MM.

Referring back to FIG. 2, the control section 20 judges whether or not the logical product calculated in the switch matrix section SM is a logic "1" and, if the result is a logic "0", controls the memory matrix section MM and the switch matrix section SM to calculate the next logical product. In the case all the logical products constituting one conversion logic equation are logic "0"s, the bit value of the coded sentence C is determined to be a logic "0", the bit value is sent to the shift register 21, and the process moves on to the operation of the next bit value.

On the other hand, if the calculated logical product is a logic "1", the bit value of the coded sentence C is determined to be a logic "1", the bit value is sent to the shift register 21, and the operation of the bit value is discontinued to move on to the operation of the next bit value. In this way, the coded sentence C is obtained within a short period of time by calculating all the bit values $A_1, A_2, \ldots$ constituting the coded sentence C based on the bit values $a_1, a_2, \ldots$ constituting the plain sentence M.

Now, the above-described coding-decoding device 11 is provided as shown in FIG. 3 with signal lines related to the memory matrix section MM and the switch matrix section SM, namely plural column choosing lines or bit lines BL0, BL1, . . . , plural memory purpose row choosing lines or memory purpose word lines WLM0, WLM1, . . . , a single switch purpose row choosing line or a switch purpose word line WLS, plural row choosing plate lines or plate lines PL0, PL1, . . . .

The coding-decoding device 11 as shown in FIG. 3 is also provided with plural rated potential generating circuits or sense amplifiers SA0, SA1, . . . as peripheral circuits of the memory matrix section MM and the switch matrix section SM.

The bit lines BL0, BL1, . . . are provided corresponding to the respective columns of the memory matrix section MM and the switch matrix section SM to choose memory cells belonging to the same column of the memory matrix section MM and the switch matrix section SM.

The memory purpose word lines WLM0, WLM1, . . . are provided corresponding to the respective rows of the memory matrix section MM to choose the memory cells belonging to the same row of the memory matrix section MM. The switch purpose word line WLS is provided to choose all the switch cells SC0, SC1, . . . of the switch matrix section SM.

The plate lines PL0, PL1, . . . are provided corresponding to the respective rows of the memory matrix section MM so as to be connected only to the second terminals 25 (See FIG. 4) of ferroelectric capacitors CF constituting the memory cells belonging to the same row of the memory matrix section MM. Details of the plate lines will be described later.

The sense amplifiers SA0, SA1, . . . are respectively connected to the bit lines BL0, BL1, . . . to produce a rated potential corresponding to the switching data at the time of reading action for the switching data from the ferroelectric capacitor CF. Details of the sense amplifiers will be described later.

Figure 4:
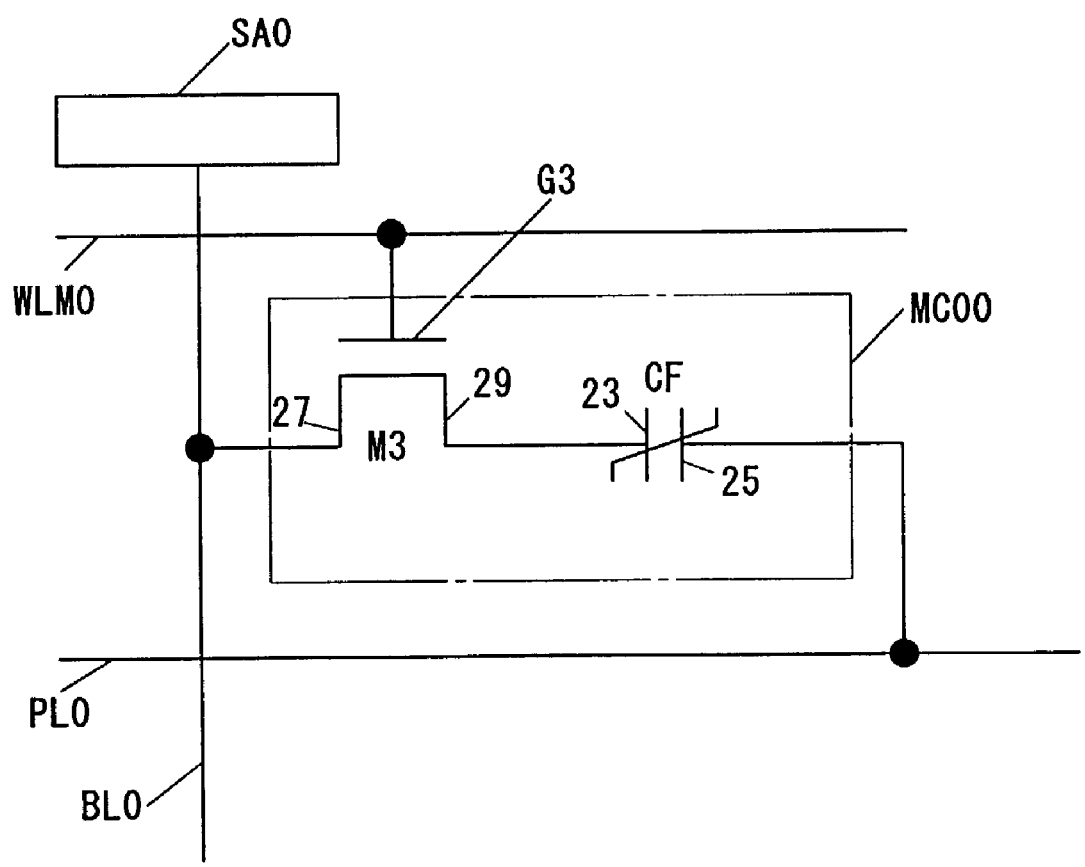
FIG. 4 is an enlarged circuit diagram of a memory cell MC00.

FIG. 4 is an enlarged circuit diagram of the memory cell MC00. As shown in FIG. 4, the memory cell MC00 is a circuit for storing the switching data using a memory element and comprises the memory element or the ferroelectric capacitor CF and a memory choosing element or a transistor M3.

The first terminal 23 of the ferroelectric capacitor CF is connected to the second input-output terminal 29 of the transistor M3. The second terminal 25 of the ferroelectric capacitor CF is connected to the plate line PL0.

The plate line PL0 is used to apply to the second terminal 25 of the ferroelectric capacitor CF, at the time of writing and reading actions for the switching data to and from the ferroelectric capacitor CF, a specified potential in a rectangular waveform in which the potentials "H" (power supply potential VDD) and "L" (ground potential GND) appear by turns.

The sense amplifier SA0 is connected to a bit line BL0. The sense amplifier SA0 generates, at the time of reading action for the switching data from the ferroelectric capacitor CF, a specified potential, an "H" potential (power supply potential VDD) or an "L" potential (ground potential GND) corresponding to the switching data.

The transistor M3 comprises: a control terminal or a gate terminal G3 connected to the memory purpose word line WLM0, a first input-output terminal 27 connected to the bit line BL0, and the terminal 29 to be conductive or nonconductive to the terminal 27 according to the control signal inputted to the gate terminal G3.

Other memory cells MC01, . . . are the same in constitution as MC00.

Figure 5:
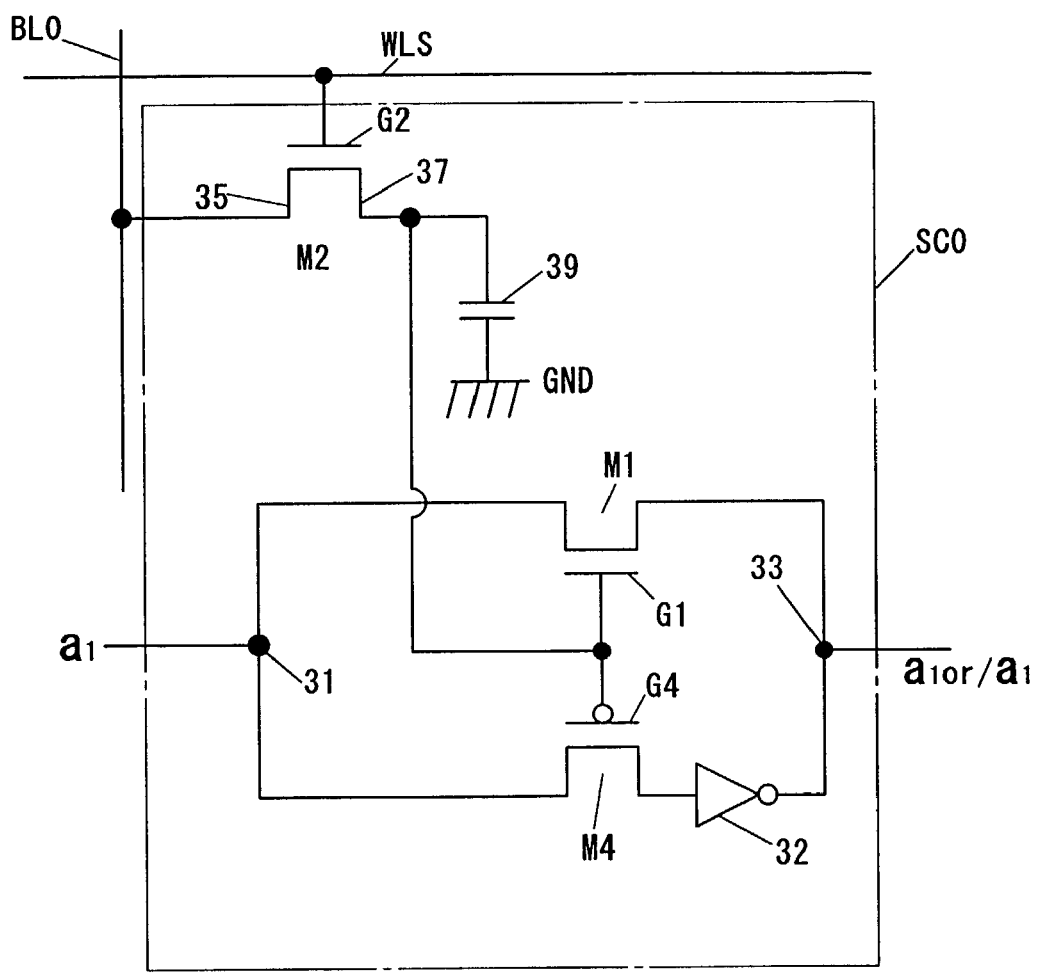
FIG. 5 is an enlarged circuit diagram of a switch cell SC0.

FIG. 5 is an enlarged circuit diagram of the switch cell SC0. As shown in FIG. 5, the switch cell SC0 is a circuit that take either non-inverted state or inverted state, comprising: a switch choosing element or a transistor M2, a capacitor 39, a pair of switch purpose field effect transistors M1, M4, and an inverter 32.

The transistor M2 comprises: a control terminal or a gate terminal G2 connected to the switching purpose word line WLS, a first input-output terminal 35 connected to the bit line BL0, and a second input-output terminal 37 to be conductive or nonconductive to the terminal 35 according to the control signal inputted to the gate terminal G2.

The transistor M1 comprises a gate terminal G1 connected to the terminal 37 of the transistor M2, and first and second switch terminals 31 and 33 to be mutually conductive or non conductive according to the control signal inputted to the gate terminal G1.

The transistor M4 comprises a gate terminal G4 connected to the terminal 37 of the transistor M2, and first and second switch terminals to be complementarily conductive or non conductive to the transistor M1 according to the control signal inputted to the gate terminal G4.

The first switch terminal of the transistor M4 is connected to the terminal 31 of the transistor M1. The second switch terminal of the transistor M4 is connected to the terminal 33 of the transistor M1 through the inverter 32.

As shown in FIG. 5, the terminal 31 is arranged to receive the first bit value $a_1$ of the plain sentence M. Therefore, when the switching data given to the switch cell SC0 through the bit line BL0 is a logic "1", the first bit value $a_1$ is directly (namely in non-inverted state as it is) outputted to the terminal 33. When the switching data given to the switch cell SC0 is logic "0", the first bit value $a_1$ is outputted as inverted (namely in inverted state) to the terminal 33. In this application document, the inverted signal of the bit value $a_1$ is expressed as "/$a_1$".

Incidentally, all the transistors M1, M2, and M3 used in this embodiment are N-channel MOSFETs (metal oxide semiconductor field effect transistors), and the transistor M4 is a P-channel MOSFET.

While this embodiment is provided with the capacitor 39 between the terminal 37 of the transistor M2 and the ground potential GND, the capacitor 39 may be omitted. However, providing the capacitor 39 makes it possible to elongate the holding time of the switching data, which will be described later.

Other switch cells SC1, . . . are the same as SC0 in constitution.

The coding-decoding device 11 is arranged to choose an intended memory cell and a corresponding switch cell from the plural memory cells MC00, MC01, . . . and plural switch cells SC00, SC01, . . . by using those bit lines BL0, BL1, . . . , memory purpose word lines WLM0, WLM1, . . . , and switch purpose word line WLS, and to determine non-inverted or inverted state of the corresponding switch cell according to the switching data of the memory cell chosen.

As described above, this embodiment is provided with the transistor M2 interposed between the transistors M1, M4, and the bit line. Therefore, even if the transistor M2 is made to conductive state and immediately made back to non-conductive state, the transistors M1 and M4 maintain for a certain period of time the conductive or non-conductive state according to the switching data given through the bit lines BL0, BL1, . . . . In other words, the switch cells SC0, SC1, . . . maintains conductive or non-conductive state according to the switching data.

In other words, providing the transistor M2 makes it possible to cause the switch cells SC0, SC1, . . . to maintain conductive or non-conductive state according to the switching data for a certain period of time without providing a special circuit to temporarily store the switching data.

Therefore, it is possible, while causing the switch cells SC0, SC1, . . . to maintain the conductive or non-conductive state corresponding to the switching data of the memory cell in one row of the memory matrix section MM, to start a reading action for the switching data from a memory cell in another row of the memory matrix section MM. As a result, total operation time may be shortened. In other words, a coding-decoding device requiring shorter operation time may be realized with a simpler wiring constitution.

Figure 6:
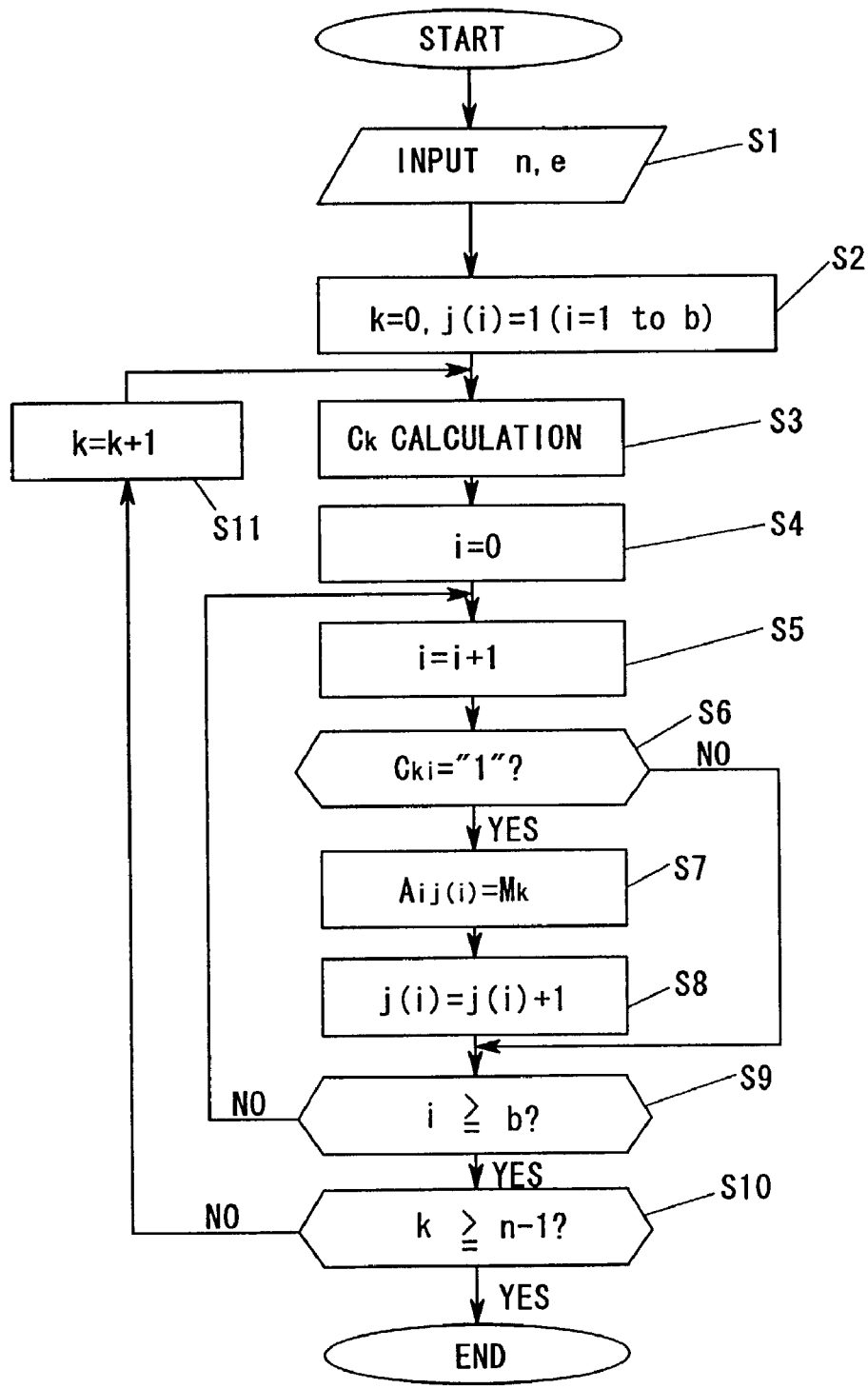
FIG. 6 is an example flowchart of the action sequence of producing a conversion logic equation and storing the produced conversion logic equation in the memory matrix section MM.

Next, the action of the coding-decoding device 11 will be described. FIG. 6 is an example flowchart of the action sequence of producing a conversion logic equation and storing the produced conversion logic equation in the memory matrix section MM. FIGS. 7 and 8 illustrate the concept of conversion logic equation producing sequence. The conversion logic equations shown as examples in these figures are not necessarily derived by using the RSA coding system. For the sake of convenience in explanation, the number b of bits of both of the plain sentence and the coded sentence in reference to FIGS. 7 and 8 is assumed to be "3". In reference to FIGS. 2 and 6 to 8, actions of conversion logic equation producing process and storing process are described below.

The control section 20 shown in FIG. 2, when a public key (n, e) is entered, takes it and initializes counter values k and j(i) (steps S1 to S2). That is to say, it is set that k=0, j(i)=1 (i=1 to b).

Next, the control section 20 calculates a coded sentence $C_k$ corresponding to a plain sentence $M_k$ (=k) (step S3). The coded sentence $C_k$ is calculated according to the following equation.

$$C_k = M_k^e \pmod{n}$$

where, since k=0, a coded sentence $C_0$ corresponding to a plain sentence $M_0$ =000 (binary number) is calculated. According to FIG. 7, $C_0$ =100 (binary number) is calculated in this step.

Next, after resetting the counter value i (i=0), the value is increased by a minimum increment value (steps S4 to S5). Next, a determination is made whether or not a bit value $C_{ki}$ of the i th bit (from the top) of the coded sentence $C_k$ is a logic "1" (step S6). Since k=0, and i=1 here, the determination is made for the bit value $C_{01}$.

Since the bit value $C_{01}$= a logic "1" according to FIG. 7, the control section 20 makes the plain sentence $M_k$ into a logical product term $A_{ij(i)}$ and stores it in b pieces of memory cells that constitute $\{(i-1)*2^{b-1}+j(i)\}$th row of the memory matrix section MM (step S7). Since k=0, and i=1 here, j(i)=j(1)=1, a plain sentence $M_0$=000 is stored as a logical product term $A_{11}$ in three pieces of memory cells MC00, MC01, and MC02 that constitute the first row of the memory matrix section MM.

Next, the control section 20, after giving a minimum increment value to j(i) (step S8), determines whether or not i has reached b (step S9). Since i=1 here, the control section 20 moves on to the step S5. Incidentally, if the bit value $C_{ki}$ is a logic "0" in the above step S6, nothing is stored in the memory matrix section MM and the control moves on to the step S9.

The control section 20 repeats the steps S5 to S9 until i reaches b. By this repetition, 0 or 1 or more pieces of logical product terms corresponding to the plain sentence $M_k$ are stored in the memory cells of 0, 1 or more rows of the memory matrix section MM.

When all the logical product terms corresponding to one plain sentence $M_k$ are stored in the memory matrix section MM, the control section 20 determines whether or not k has reached n−1 (step S10). In this embodiment, it is assumed that n=$2^b$. Since k=1, n=8 here, the control section 20, after giving a minimum increment value to k (step S11), moves on to the step S3.

The control section 20 repeats the steps S3 to S11 until k reaches n−1. By this repetition, all the logical product terms corresponding to the plain sentence $M_k$ (k=0 to n−1) are stored in the memory matrix section MM. In the example shown in FIG. 7, 12 pieces of logical product terms corresponding to the plain sentence $M_k$ (k=0 to 7) are stored in the memory cells of the 1st to 12th rows of the memory matrix section MM.

Of the 12 logical product terms shown in FIG. 7, for example four logical product terms "000", "011", "101", and "110" listed in the box $A_{1j(i)}$ become the logical product terms that constitute bit $A_1$. In general, respective bit values $A_i$ of the coded sentence C are constituted with $2^{b-1}$ pieces of logical product terms $A_{1j(i)}$ (j(i)=1 to $2^{b-1}$).

In the example shown in FIG. 7, four logical product terms $A_{11}$, $A_{12}$, $A_{13}$, and $A_{14}$ corresponding to the bit value $A_1$ are stored in the 1st to 4th rows of the memory matrix section MM, four logical product terms $A_{21}$, $A_{22}$, $A_{23}$, and $A_{24}$ corresponding to the bit value $A_2$ are stored in the 5th to 8th rows, and four logical product terms $A_{31}$, $A_{32}$, $A_{33}$, and $A_{34}$ corresponding to the bit value $A_3$ are stored in the 9th to 12th rows.

FIGS. 8A to 8C illustrate the conversion logic equations representing the bit values $A_1$, $A_2$, and $A_3$. For example, the bit value $A_1$ shown in FIG. 8A is expressed as the logical sum of the four logical product terms $A_{11}$, $A_{12}$, $A_{13}$, and $A_{14}$. Generally the respective bit values $A_i$ of the coded sentence C are expresses as the logical sum of $2^{b-1}$ pieces of logical product terms $A_{1j(i)}$ (j(i)=1 to $2^{b-1}$). The conversion logic equation producing process and the storing process are performed in this way.

Figure 9:
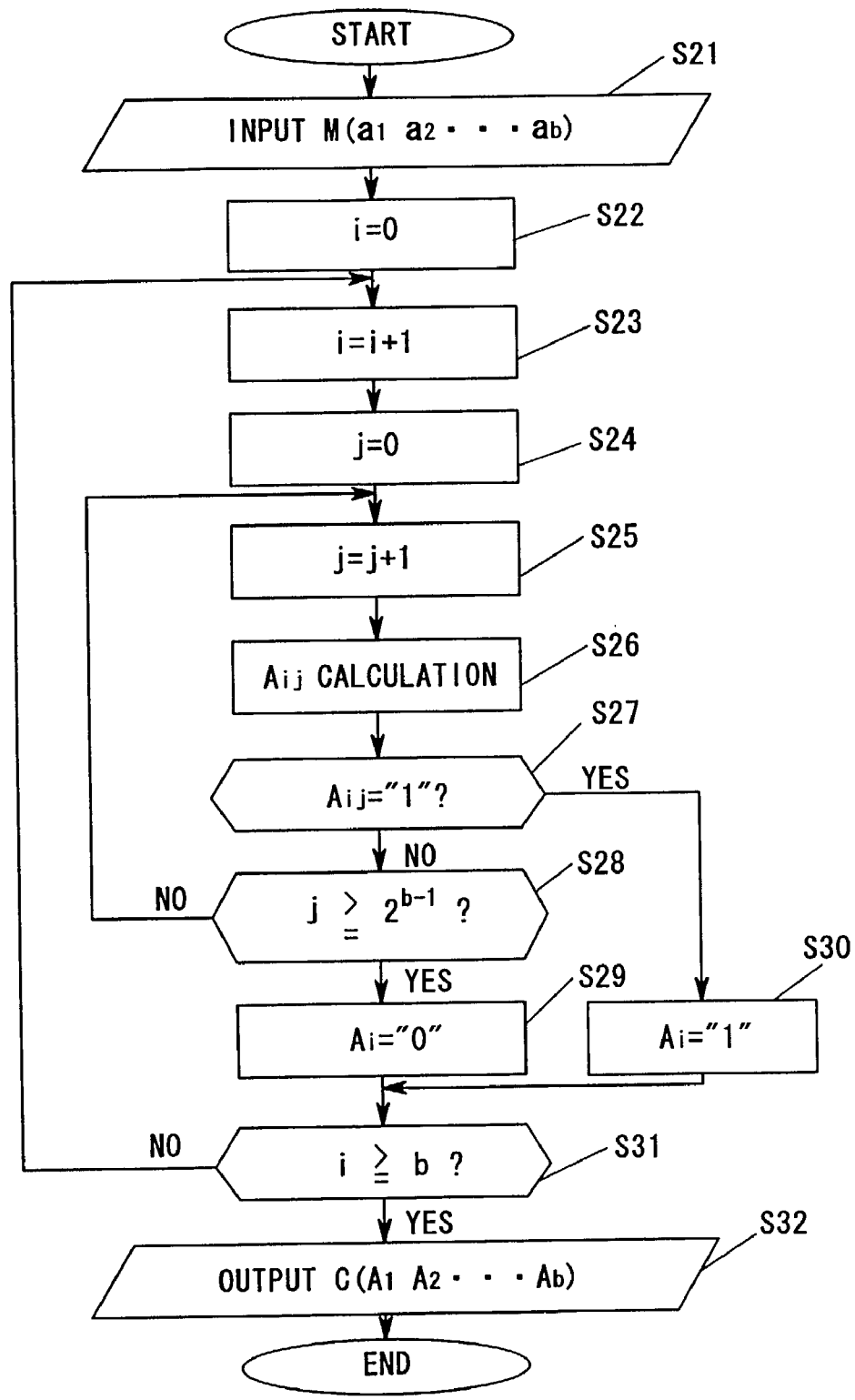
FIG. 9 is an example flowchart of an action procedure of converting an inputted plain sentence M into a coded sentence C according to a conversion logic equation stored in the memory matrix section MM.
Figure 10:
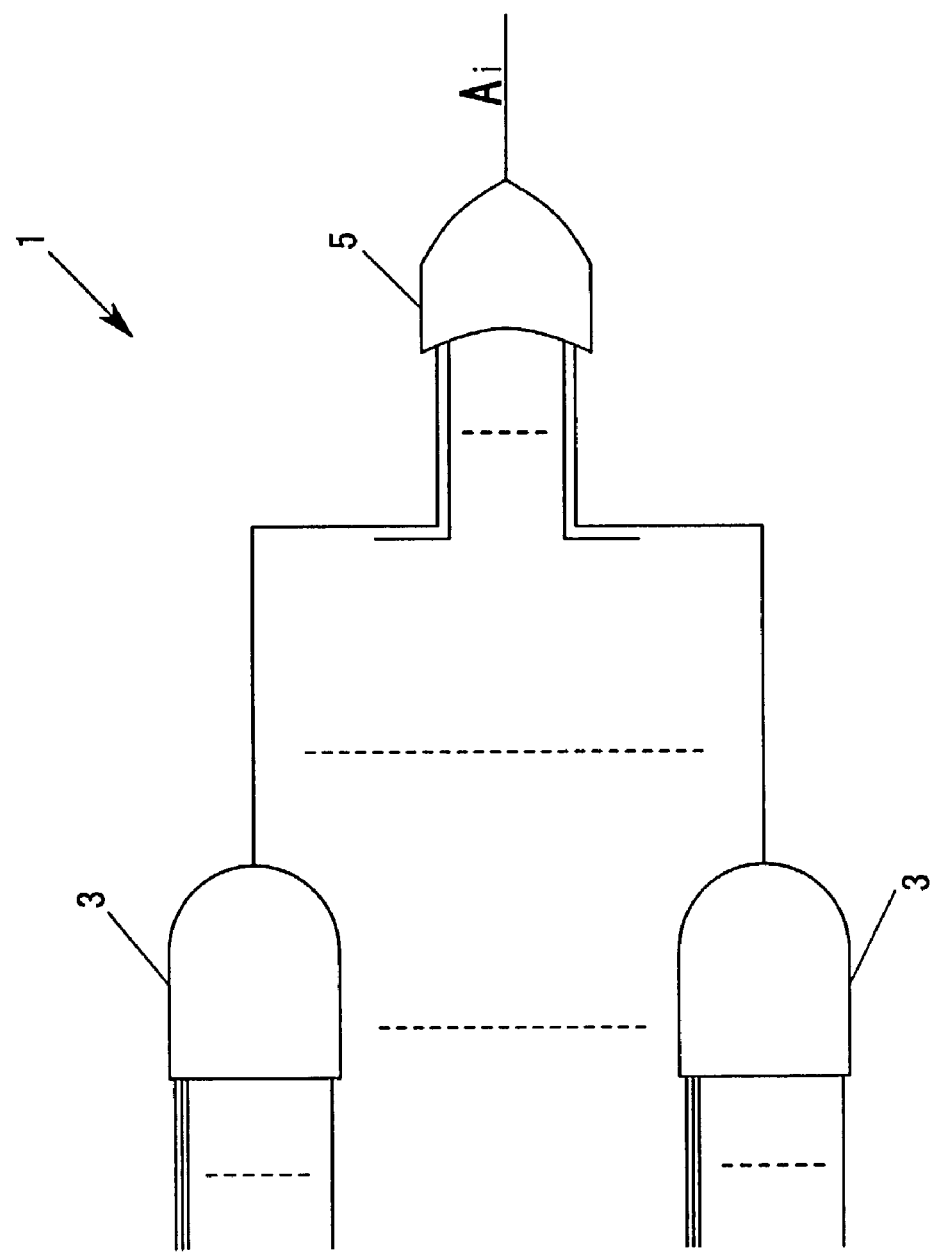
FIG. 10 shows a coding circuit constituted with hardware only.

FIG. 9 is an example flowchart of an action procedure of converting an inputted plain sentence M into a coded sentence C according to a conversion logic equation stored in the memory matrix section MM. The coding process actions are described in reference to FIGS. 2 and 9.

The control section 20 shown in FIG. 2, when a plain sentence M ($a_1a_2a_3 \ldots a_b$) of b bits is entered, takes it, resets the counter value i and gives a minimum increment value to it, resets the counter j and gives it a minimum increment value (steps S21 to S25). That is, setting is made as k=1, j=1.

Next, the control section 20 calculates the logical value (logical products) of the logical product term $A_{ij}$ according to the logical product term $A_{ij}$ stored in the memory matrix section MM on the basis of the plain sentence M ($a_1a_2a_3 \ldots a_b$) (step S26).

At the time of calculating the logical values (logical products) of the logical product term $A_{ij}$, a word parallel operation is performed. That is to say, when calculating the logical product, the switch purpose word line WLS shown in FIG. 3 is made effective. One of the plural memory purpose word lines WLM0, WLM1, . . . , for example the word line WLM0 is chosen. At the same time, one of the plural plate lines PL0, PL1, . . . , for example the plate line PL0 is chosen. Besides, all the bit lines BL0, BL1, . . . and all the sense amplifiers SA0, SA1, . . . are made effective. Performing the word parallel operation in this way makes it possible to calculate the logical values of the logical product term $A_{ij}$ within a short period of time.

Next, the control section 20 determines whether or not the logical value of the calculated logical product term $A_{ij}$ is a logic "1" (step S27). Since k=1, j=1 here, the determination is made for the logical value of the logical product term $A_{11}$.

In the case the logical value of the logical product term $A_{ij}$ is a logic "0", the control section 20 determines whether or not j has reached $2^{b-1}$ (step S28). Since j=1 here, the control section 20 moves on to the step S25. The control section 20 repeats the steps S25 to S28 until j reaches $2^{b-1}$ or the logical value of the logical product term $A_{ij}$ becomes a logic "1".

In the case j has reached $2^{b-1}$, it is judged that the bit value $A_i$ of the coded sentence C is a logic "0", the bit vale $A_i$=0 is sent to the bottom place bit of the shift register 21 (steep S29), and the control moves on to the step S31.

On the other hand, in the case the logical value of the logical product term $A_{ij}$ is a logic "1" in the step S27, the bit value $A_i$ of the coded sentence C is determined to be a logic "1", the bit value $A_i$=1 is sent to the bottom place bit of the shift register 21, the operation on the bit value $A_i$ is discontinued, and the control moves on to the step S31 (step S30).

The control section 20 in the step S31 judges if i has reached b. Since i=1 here, the control section 20 moves on to the step S23. The control section 20 repeats the steps S23 to S31 until i reaches b. By this repetition, all the bit value $A_i$ (i=1 to b) of the coded sentence C corresponding to the plain sentence M entered are calculated.

Therefore, the coded sentence C ($A_1A_2 \ldots A_b$) corresponding to the plain sentence M is held in the shift register 21. The control section 20 outputs the coded sentence C ($A_1A_2 \ldots A_b$) held in the shift register 21 (step S32). Thus the coding process is carried out.

Incidentally, the above steps S1 to S11 correspond to the conversion logic equation producing device 13 and the memory device 15 shown in FIG. 1. The steps S21 to S31 correspond to the operation device 17, and the step S32 corresponds to the output device 19.

As described above, since this embodiment is arranged, in calculating the coded sentence C from the plain sentence M, to perform logical operations using the switch matrix section SM logically constituted according to the conversion logic equation derived in advance, the operation time is shorter in comparison with the case of numerical operation using software.

Since the conversion logic equation is expressed as the logical sum of the logical product terms along with performing the operation by changing the combination of logic circuits for every logical product term using the programmable switch matrix section SM, a less number of logical gates suffice the purpose in comparison with using fixed hardware logic circuits corresponding to the conversion logic equations. In other words, a coding-decoding device that requires less time for coding and decoding may be realized with less number of logic gates.

This embodiment is also arranged that, when any of the logical products constituting the conversion logic equation becomes a logic "1", the bit value is determined to be a logic "1" and the operation on the bit value is discontinued, so that the operation time is further shortened.

This embodiment is also arranged to produce b pieces of conversion logic equations by arranging as follows. That is to say, when a public key is given, all the plain sentences are converted first to coded sentences according to the public key given. At the same time, a term (logical product term) is given that represents the logical product of all the bit values constituting the corresponding plain sentence as the term corresponding to the bit having a bit value of a logic "1" of the coded sentence obtained by the conversion. And logical sum of the logical product terms for every bit value of b pieces of coded sentences is taken to produce b pieces of conversion logic equations. Therefore, it is possible to automatically produce the conversion logic equations according to the public key given and store them in the memory matrix section MM.

Incidentally, while the above embodiment is described as an example using the ferroelectric capacitor as the memory element for constituting the memory cell, the example is not restrictive. For example, other types of ferroelectric memory elements such as the ferroelectric transistor may also be used as a memory element for constituting the memory cell. Furthermore, nonvolatile memory elements other than the ferroelectric memory element such as the E²PROM, or volatile memory elements such as the cross-coupled flip-flop may also be used as the memory element for constituting the memory cells.

However, using the ferroelectric memory element for constituting the memory cell is advantageous because it enables high speed reading and writing actions without requiring a backup power supply or special writing devices.

While the above embodiment is described as an example provided with a circuit using as the switch cells the transistor M2, the capacitor 39, the transistors M1, M4, and the inverter 32, the switch cells are not limited to those circuits.

The above embodiment is also described as an example in which the coding-decoding device has an output device. However, the present invention is not limited to that example. For example, the coding-decoding device may be arranged without an output device, so that an external device is provided with an output device.

The above embodiment is also described as an example in which the coding-decoding device has a conversion logic equation producing device. However, the present invention is not limited to that example. For example, the coding-decoding device may be arranged without a conversion logic equation producing device, so that an external conversion logic equation producing device is provided.

In the above embodiment, the operation device is arranged to determine the bit value to be a logic "1" and to discontinue the operation of determining the bit value of the second sentence when any of the logical products constituting the conversion logic equation corresponding to the bit value becomes a logic "1". However, the present invention is not limited to that arrangement. For example, it may also be arranged that all the logical products are calculated irrespective of whether or not any of the logical products constituting the conversion logic equation has become a logic "1".

In the above embodiment, the execution unit logic equation is arranged to determine a single logical product. However, the present invention is not limited to that arrangement. For example, the execution unit logic equation may also be arranged to determine two or more logical products simultaneously.

In that case, the execution unit logic equation may be arranged to be a logical operation equation for determining two or more logical products contained in one conversion logic equation corresponding to one bit value of the second sentence, or to be a logical operation equation for determining two or more logical products constituting two or more conversion logic equations corresponding to two or more bit values. In the latter case, the execution unit logic equation may be arranged for determining simultaneously the logical products of the same column constituting all the conversion logic equations for determining all the bit values.

In the above embodiment, the conversion logic equation used is the one that expresses the bit values of the second sentence as the logical sum of the logical products containing the bit values of the first sentence as elements. However, the conversion logic equation is not limited to that logic equation.

While the above embodiment is described as an example in which the coding-decoding device performs a coding process, this invention is not limited to the example but may also be applied to a case in which the coding-decoding device performs a decoding process.

While the above embodiment is described as an example in which the coding-decoding device is used for coding and decoding of the RSA codes, this invention is not limited to the example but may also be applied to a case in which the coding-decoding device is used for coding and decoding of codes other than the RSA codes.

The coding-decoding device of the present invention is the one that uses a memory device and an operation device having a programmable hardware logic circuit to convert a first sentence expressed with binary numbers into a second sentence expressed with binary numbers of b bits. The memory device substantially stores b pieces of conversion logic equations for calculating b pieces of bit values of the second sentence, with each equation containing the bit values of the first sentence as elements. The operation device, according to plural execution unit logic equations obtained by dividing b pieces of conversion logic equations stored in the memory device into execution units, sequentially performs logic constitution using a hardware logic circuit, sequentially divides and calculates the second sentence from the first sentence according to the logic constitution.

The coding-decoding method of the present invention is the one that uses a memory device and an operation device having a programmable hardware logic circuit to convert a first sentence expressed with binary numbers into a second sentence expressed with binary numbers of b bits, and comprises a conversion logic equation storing step and an operation step. In the conversion logic equation storing step, b pieces of conversion logic equations for calculating b pieces of bit values of the second sentence, with each conversion logic equation containing bit values of the first sentence as elements, are substantially stored in a memory device. In the operation step, the operation device is caused to constitute logics sequentially for respective execution unit logic equations while using a hardware logic circuit according to the plural execution unit logic equations obtained by dividing the b pieces of conversion logic equations stored in the memory device into execution units, and sequentially divides and calculates the second sentence from the first sentence on the basis of the constituted logics.

Thus, when the coding-decoding device and the coding-decoding method of the present invention are used to calculate the second sentence from the first sentence, the calculating operation is carried out using the hardware logic circuits logically constituted according to the conversion logic equations derived beforehand. Therefore, the operation time is shorter in comparison with the case of numerical operation using software.

The conversion logic equation is divided into plural execution unit logic equations and the programmable hardware logic circuit is used to carry out operation by rearranging the logic circuits for respective execution unit logic equations. Therefore, the number of logic gates may be smaller than when using fixed hardware logic circuits corresponding to the conversion logic equations.

In other words, a coding-decoding device and a coding-decoding method requiring less time and less number of logic gates for coding and decoding may be realized.

With the coding-decoding device of the present invention, the conversion logic equation is expressed with the bit values of the second sentence as a logical sum of logical products containing the bit values of the first sentence as elements. The execution unit logic equation is a logical operation equation for determining the logical products. The operation device is arranged to determine the bit value to be a logic "1" when any of the logical products constituting the conversion logic equation corresponding to the bit value becomes a logic "1", when calculating the bit value of the second sentence, and to discontinue calculating the bit value.

Therefore, making the execution unit logic equation a logical operation equation for determining logical products makes it possible to further reduce the number of logic gates. It is also possible to further shorten the operation time by constituting that the bit value is determined to be a logic "1" when any of the logical products constituting the conversion logic equation becomes a logic "1" and calculating the bit value is discontinued.

The coding-decoding device of the present invention is further provided with a conversion logic equation producing device for producing b pieces of conversion logic equations by converting all the first sentences into the second sentences according to a given conversion method, giving a term representing a logical product of all the bit values constituting the first sentence corresponding as a term corresponding to the bit for which the bit value of the second sentence obtained by conversion is a logic "1", and taking a logical sum of the terms representing the logical products for the respective b pieces of bit values of the second sentence.

Therefore, once a conversion method including for example a code type and a code key is given, it is possible to produce beforehand conversion logic equations according to the conversion method given, and store them in the memory device.

While the present invention is described above by way of a preferable embodiment, the terms used herein are not restrictive but illustrative and they may be changed within the scope of appended claims without departing from the scope and spirit of the present invention.

What is claimed is:

1. A coding-decoding device using a memory device and an operation device having a programmable hardware logic circuit, for converting first sentences expressed with binary numbers into second sentences expressed with binary numbers of b bits,
    wherein said memory device stores b pieces of conversion logic equations, each including the bit values of said first sentence as elements, for calculating the bit values of said second sentence, and
    wherein said operation device, according to plural execution unit logic equations obtained by dividing into execution units said b pieces of conversion logic equations stored in said memory device, sequentially constitutes logics for each of said execution unit logic equations, and sequentially divides and calculates from said first sentences, on the basis of said constituted logics, said second sentences,
    the coding-decoding device comprising a conversion logic equation producing device for producing said b pieces of conversion logic equations by converting all the first sentences into second sentences according to a given conversion method, giving a term representing the logical product of all the bit values constituting the first sentence corresponding as the term corresponding to the bit for which the bit value of the second sentence obtained by conversion is a logic "1", and taking a logical sum of the logical product for each of b bits of the bit values of the second sentences.

2. A coding-decoding device using a memory device and an operation device having a programmable hardware logic circuit, for converting first sentences expressed with binary numbers into second sentences expressed with binary numbers of b bits,
    wherein said memory device stores b pieces of conversion logic equations, each including the bit values of said first sentence as elements, for calculating the bit values of said second sentence, and
    wherein said operation device, according to plural execution unit logic equations obtained by dividing into execution units said b pieces of conversion logic equations stored in said memory device, sequentially constitutes logics for each of said execution unit logic equations, and sequentially divides and calculates from said first sentences, on the basis of said constituted logics, said second sentences,
    wherein said conversion logic equation is expressed with the bit values of said second sentence as a logical sum of logical products containing the bit values of said first sentence as elements,
    wherein said execution unit logic equation is a logical operation equation for determining said logical products, and
    wherein said operation device is arranged to determine said bit value to be a logic "1" and to discontinue the bit value operation at the time point when any of said logical products constituting the conversion logic equation corresponding to said bit value becomes a logic "1" during the calculating operation of determining the bit values of said second sentence,
    the coding-decoding device comprising a conversion logic equation producing device for producing said b pieces of conversion logic equations by converting all the first sentences into second sentences according to a given conversion method, giving a term representing the logical product of all the bit values constituting the first sentence corresponding as the term corresponding to the bit for which the bit value of the second sentence obtained by conversion is a logic "1", and taking a logical sum of the logical product for each of b bits of the bit values of the second sentences.

3. A coding-decoding method using a memory device and an operation device having a programmable hardware logic circuit, to convert a first sentence expressed with binary numbers into a second sentence expressed with binary numbers of b bits, comprising:
    a conversion logic equation storing step of storing in said memory device b pieces of conversion logic equations for calculating b pieces of bit values of the second sentence, with respective conversion logic equations containing the bit values of said first sentence as elements,
    a calculating operation step of causing said operation device to constitute logics sequentially for respective execution unit logic equations while using a hardware logic circuit according to the plural execution unit logic equations obtained by dividing the b pieces of conversion logic equations stored in said memory device into execution units, and to sequentially divide and calculate said second sentence from said first sentence on the basis of the constituted logics, and
    a conversion logic equation producing step of producing said b pieces of conversion logic equations by converting all the first sentences into the second sentences according to a given conversion method, giving a term representing the logical product of all the bit values constituting the first sentence corresponding as the term corresponding to the bit having a bit value of a logic "1" of the second sentence obtained by conversion, and taking the logical sum of the term representing the logical product for the respective b, pieces of bit values of the second sentence.

4. A coding-decoding method using a memory device and an operation device having a programmable hardware logic circuit to convert a first sentence expressed with binary numbers into a second sentence expressed with binary numbers of b bits, comprising:

a conversion logic equation storing step of storing in said memory device b pieces of conversion logic equations for calculating b pieces of bit values of the second sentence, with respective conversion logic equations containing the bit values of said first sentence as elements, and a calculating operation step of causing said operation device to constitute logics sequentially for respective execution unit logic equations while using a hardware logic circuit according to the plural execution unit logic equations obtained by dividing the b pieces of conversion logic equations stored in said memory device into execution units, and to sequentially divide and calculate said second sentence from said first sentence on the basis of the constituted logics, wherein said conversion logic equation is expressed with the bit values of said second sentence as the logical sum of logical products including the bit values of said first sentence as elements, wherein said execution unit logic equation is a logical operation equation for determining said logical products, and wherein said calculating operation step is arranged to determine the bit value to be a logic "1" during the calculating operation of the bit value of the second sentence and discontinue the calculating operation of the bit value at the time point when any of said logical products constituting the conversion logic equation corresponding to the bit value becomes a logic "1", the coding decoding method comprising a conversion logic equation producing step of producing said b pieces of conversion logic equations by converting all the first sentences into the second sentences according to a given conversion method, giving a term representing the logical product of all the bit values constituting the first sentence corresponding as the term corresponding to the bit having a bit value of a logic "1" of the second sentence obtained by conversion, and taking the logical sum of the term representing the logical product for the respective b, pieces of bit values of the second sentence.

* * * * *